United States Patent
Chen

(10) Patent No.: US 10,672,852 B1
(45) Date of Patent: Jun. 2, 2020

(54) MOBILE TERMINAL

(71) Applicant: BEIJING XIAOMI MOBILE SOFTWARE CO., LTD., Beijing (CN)

(72) Inventor: Chaoxi Chen, Beijing (CN)

(73) Assignee: BEIJING XIAOMI MOBILE SOFTWARE CO., LTD., Beijing (CN)

(*) Notice: Subject to any disclaimer, the term of this patent is extended or adjusted under 35 U.S.C. 154(b) by 0 days.

(21) Appl. No.: 16/699,598

(22) Filed: Nov. 30, 2019

(30) Foreign Application Priority Data

Aug. 30, 2019 (CN) .......................... 2019 1 0818544

(51) Int. Cl.
| | |
|---|---|
| H01L 27/32 | (2006.01) |
| H05B 45/00 | (2020.01) |
| H05B 45/10 | (2020.01) |
| H01L 51/52 | (2006.01) |
| H04M 1/02 | (2006.01) |
| H05B 47/11 | (2020.01) |

(52) U.S. Cl.
CPC ........ *H01L 27/3269* (2013.01); *H01L 27/323* (2013.01); *H01L 51/5281* (2013.01); *H04M 1/0266* (2013.01); *H05B 45/10* (2020.01); *H05B 45/60* (2020.01); *H05B 47/11* (2020.01); *H04M 2250/12* (2013.01)

(58) Field of Classification Search
CPC ............... H01L 27/3269; H01L 27/323; H01L 51/5281; H04M 1/0266; H04M 2250/12; H05B 45/60; H05B 47/11; H05B 45/10
USPC ........................................................ 315/155
See application file for complete search history.

(56) References Cited

U.S. PATENT DOCUMENTS

| | | | | |
|---|---|---|---|---|
| 6,259,108 | B1* | 7/2001 | Antonelli ........... | G06K 9/00046 250/556 |
| 2016/0380213 | A1* | 12/2016 | Qiu ....................... | H01L 51/006 257/40 |
| 2017/0251137 | A1* | 8/2017 | Evans, V ............. | H04N 5/2252 |
| 2018/0248153 | A1* | 8/2018 | Cui ...................... | H01L 51/5256 |
| 2018/0315945 | A1* | 11/2018 | Wang .................. | H01L 51/5278 |
| 2019/0158643 | A1* | 5/2019 | Zhang ................. | H04M 1/0277 |
| 2019/0245958 | A1* | 8/2019 | Cheng .................. | G06F 1/1626 |
| 2019/0379781 | A1* | 12/2019 | Ma ....................... | G06F 1/16 |
| 2020/0020887 | A1* | 1/2020 | Li ........................ | H01L 27/3244 |
| 2020/0050818 | A1* | 2/2020 | He ....................... | G06K 9/0004 |
| 2020/0057340 | A1* | 2/2020 | Jiang .................... | G06K 9/0004 |

* cited by examiner

*Primary Examiner* — Don P Le
(74) *Attorney, Agent, or Firm* — Syncoda LLC; Feng Ma

(57) ABSTRACT

A mobile terminal includes: a body, an organic light-emitting diode (OLED) screen component over a surface of the body, a first light sensor, and a second light sensor. The OLED screen component includes: a self-emitting light layer and a light transmitting functional layer above the self-emitting light layer; at least one optical microhole in the self-emitting light layer; the first and second light sensors are disposed under the self-emitting light layer and at positions corresponding to the optical microhole; a first polarizer and a quarter phase retarder are disposed on the first optical path; an incident light path of a ambient light to the first light sensor passes through the first polarizer and a second polarizer, and polarization directions of the first polarizer and the second polarizer are perpendicular; an incident light path of the ambient light to the second light sensor passes through the first polarizer.

20 Claims, 3 Drawing Sheets

MOBILE TERMINAL

CROSS-REFERENCE TO RELATED APPLICATION

This application claims priority to Chinese Patent Application No. 201910818544.1, filed on Aug. 30, 2019, the disclosure of which is hereby incorporated by reference in its entirety.

BACKGROUND

Mobile terminals such as mobile phones are usually equipped with a light sensor for sensing light intensity. The light sensor can be disposed under the screen of the mobile terminal. The light sensor can obtain ambient light intensity of front area of the screen of the mobile terminal, so that the mobile terminal can adaptively adjusts brightness of the screen according to the ambient light intensity, thereby providing a better visual effect to the users.

SUMMARY

The present disclosure relates to the field of terminal technology, particularly to a mobile terminal.

According to an aspect of the embodiments of the present disclosure, a mobile terminal is provided, including: a body, an OLED screen component, a first light sensor and a second light sensor;

where, the OLED screen component is disposed on the surface of the body, and the OLED screen component includes: a self-emitting light layer and a light transmitting functional layer above the self-emitting light layer; at least one optical microhole is formed in the self-emitting light layer;

the first light sensor and the second light sensor are disposed under the self-emitting light layer and at positions corresponding to the optical microhole;

where, an incident light path of the light emitted by the self-emitting light layer to the light transmitting functional layer, and a reflected light path formed by the light reflected by the light transmitting functional layer, form a first optical path; a first polarizer and a quarter phase retarder are disposed on the first optical path;

an incident light path of ambient light to the first light sensor passes through the first polarizer and a second polarizer, and polarization directions of the first polarizer and the second polarizer are perpendicular; an incident light path of the ambient light to the second light sensor passes through the first polarizer.

In some embodiments, the first polarizer is disposed above the self-emitting light layer, and the quarter phase retarder is disposed above the first polarizer.

In some embodiments, the second polarizer is disposed between the first light sensor and the self-emitting light layer.

In some embodiments, photosensitive areas of the first light sensor and the second light sensor overlap.

In some embodiments, the light transmitting functional layer includes a combination of any one or more of followings: a glass cover plate and a touch panel.

In some embodiments, the mobile terminal further includes: a processing component, configured to:

obtain a first measurement value of the first light sensor and a second measurement value of the second light sensor;

calculate a difference value between the second measurement value and twice of the first measurement value; and determine the light intensity of the ambient light according to the difference value.

According to another aspect of the embodiments of the present disclosure, a mobile terminal is provided, including: a body, an OLED screen component and a light sensor;

where, the OLED screen component is disposed on the surface of the body, and the OLED screen component includes: a self-emitting light layer and a light transmitting functional layer above the self-emitting light layer; at least one optical microhole is formed in the self-emitting light layer;

the light sensor is disposed under the self-emitting light layer and at a position corresponding to the optical microhole;

where, an incident light path of the light emitted by the self-emitting light layer to the light transmitting functional layer, and a reflected light path formed by the light reflected by the light transmitting functional layer, form a first optical path; a polarizer and a quarter phase retarder are disposed on the first optical path;

an incident light path of the ambient light to the light sensor passes through the light transmitting functional layer, the quarter phase retarder, the polarizer and the optical microhole.

In some embodiments, the polarizer is disposed above the self-emitting light layer, and the quarter phase retarder is disposed above the polarizer.

In some embodiments, the light transmitting functional layer includes a combination of any one or more of followings: a glass cover plate and a touch panel.

In some embodiments, the mobile terminal further includes: a processing component, configured to:

obtain a measurement value of the light sensor; and determine the light intensity of the ambient light according to the measurement value.

It is to be understood that the above general descriptions and the following detailed descriptions are only exemplary and explanatory and not intended to limit the present disclosure.

BRIEF DESCRIPTION OF THE DRAWINGS

In order to illustrate the technical solutions of the embodiments of the present disclosure more clearly, the accompanying drawings used in the description of the embodiments will be briefly described below. Apparently, the accompanying drawings in the following description are merely some embodiments of the present disclosure. Those of ordinary skills in the art can also obtain other accompanying drawings based on these accompanying drawings without going through any creative effort.

DETAILED DESCRIPTION

Exemplary embodiments will be illustrated in detail here, examples of which are expressed in the accompanying drawings. When the following description refers to the accompanying drawings, the same numbers in different accompanying drawings represent the same or similar elements unless otherwise indicated. The implementations described in the following exemplary embodiments do not represent all the implementations consistent with the present disclosure. Instead, they are merely examples of devices and methods consistent with aspects of the present disclosure as recited in the appended claims.

For a mobile terminal equipped with an Organic Light-Emitting Diode (OLED) screen, because the OLED screen has the characteristic of self-emitting light, the light intensity generated by the OLED screen can affect the measurement accuracy of the ambient light intensity by the light sensor.

Figure 1:
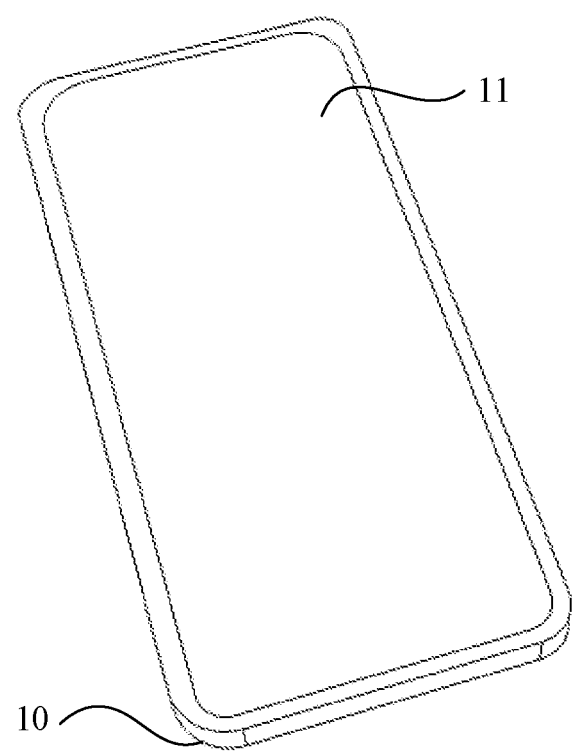
FIG. 1 is a schematic diagram shown a mobile terminal according to an exemplary embodiment.
Figure 2:
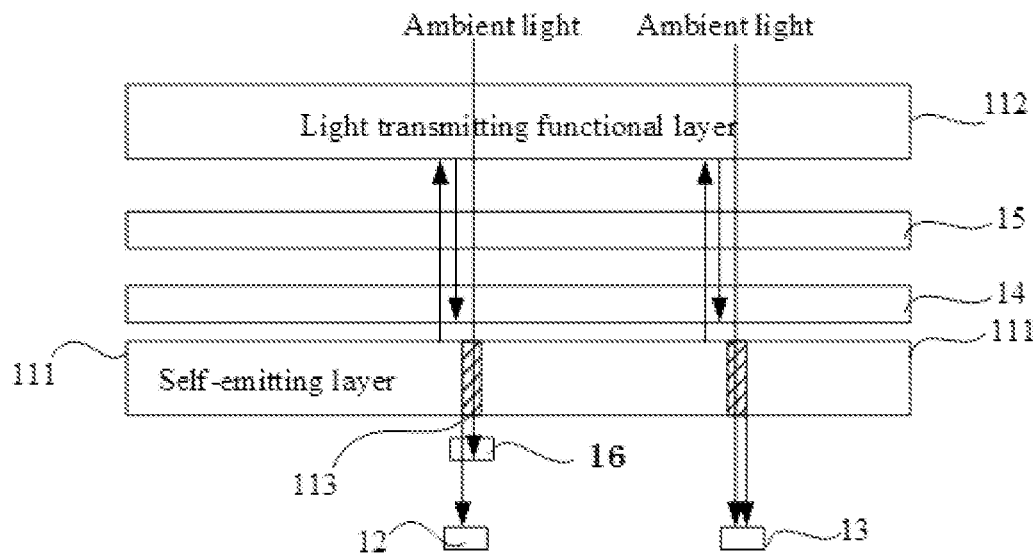
FIG. 2 is a schematic diagram shown an optical path design according to an exemplary embodiment.

Referring to FIG. 1 and FIG. 2, a schematic structural diagram of a mobile terminal is exemplarily shown. The mobile terminal includes a body 10, an OLED screen component 11, a first light sensor 12 and a second light sensor 13.

The body 10, which may also be referred to as a mobile phone body, is a main body frame of the mobile terminal. The body 10 is generally in the shape of a hexahedron, and a part of edges or corners of the hexahedron may be formed with a curved chamfer. The front surface of the body 10 is generally a rounded rectangle or a rectangular rectangle.

The OLED screen component 11 is disposed on the surface of the body 10. In some embodiments, the OLED screen component 11 is disposed on the front surface of the body 10. In some other embodiments, the OLED screen component 11 may also be disposed on the back surface or side surface of the body 10, the position of the OLED screen component 11 on the body 10 is not limited in the embodiments of the present disclosure.

In the present embodiment, through disposing the two light sensors of the first light sensor 12 and the second light sensor 13, and through calculating the measurement values of the two light sensors, the influence of the light intensity generated by the OLED screen on the measurement accuracy of the ambient light is eliminated, thereby improving the measurement accuracy of the ambient light.

As is shown in FIG. 2, the OLED screen component 11 includes: a self-emitting light layer 111 and a light transmitting functional layer 112 above the self-emitting light layer 111, at least one optical microhole 113 is formed in the self-emitting light layer 111. FIG. 2 is only an example in which one optical microhole 113 is formed in the self-emitting light layer 111. The number of the optical microholes 113 is not limited in the embodiments of the present disclosure.

The self-emitting light layer 111 refers to a layer level having the characteristic of self-emitting light in the OLED screen component 11. The self-emitting light layer 111 is also referred to as an organic light-emitting layer, which is made of an organic light-emitting material. The principle of light-emitting of the self-emitting light layer 111 is as follows: under the driven by an applied voltage, holes and electrons are injected from positive and negative electrodes into the self-emitting light layer 111 respectively, the electrons and the holes meet and recombine in the self-emitting light layer 111, releasing energy and transferring the energy to molecules of the organic light-emitting material, making the molecules transit from the ground state to the excited state. The excited state is unstable, the excited molecules return from the excited state to the ground state, and radiation transitions produce luminescence phenomenon.

The light transmitting functional layer 112 refers to a layer level having light transmitting properties in the OLED screen component 11, that is, the light transmittance of the light transmitting functional layer 112 is greater than zero. The light transmittance is a percentage of the luminous flux transmitted through the medium (such as the light transmitting functional layer 112 in the embodiments of the present disclosure) and the incident luminous flux. The light transmittance may also be referred to as transmittance. In some embodiments, the light transmittance of the light transmitting functional layer 112 is greater than a preset threshold, such as the light transmittance of the light transmitting functional layer 112 is greater than 30%. The light transmitting functional layer 112 may be made of a light transmitting material such as glass, light transmitting ink or light transmitting plastic.

In some embodiments, the light transmitting functional layer 112 includes a combination of any one or more of the followings: a glass cover plate and a touch panel. The glass cover has a function of protecting the internal structure of the mobile terminal; the touch panel has a function of receiving a user's touch operation (such as clicking, sliding, pressing, etc.).

The optical microhole 113 refers to a through hole penetrating the self-emitting light layer 111 from the top to the bottom and having a light transmitting function. In some embodiments, the optical microhole 113 is a through hole of a micron-scale or smaller unit level, that is, the optical microhole 113 is a through hole that is invisible to naked eyes.

Figure 3:
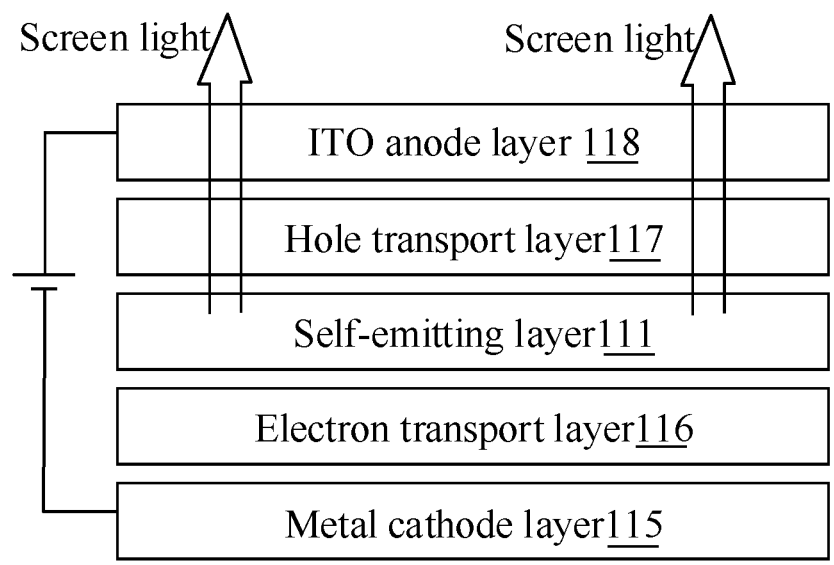
FIG. 3 is a schematic structural diagram shown an OLED screen component according to an exemplary embodiment.

In some embodiments, as is shown in FIG. 3, the OLED screen component 11 further includes a metal cathode layer 115, an electron transport layer 116, a hole transport layer 117 and an Indium Tin Oxide (ITO) anode layer 118. In the layer structure of the OLED screen component 11, the uppermost layer is the ITO anode layer 118, below the ITO anode layer 118 is the hole transport layer 117, below the hole transport layer 117 is the self-emitting light layer 111, below the self-emitting light layer 111 is the electron transport layer 116, and below the electron transport layer 116 is the metal cathode layer 115. The above described metal cathode layer 115 and the ITO anode layer 118 are connected to a power source, when the OLED screen component 11 is powered on, the metal cathode layer 115 generates electrons, and the ITO anode layer 118 generates holes, under the action of electric field force, the electrons pass through the electron transport layer 116, the holes pass through the hole transport layer 117, and reach the self-emitting light layer 111. The electrons have a positive charge, the holes have a negative charge, the electrons and holes attract each other, and are bound together by Coulomb force to form excitons. The excitons excite the light-emitting molecules, causing the light-emitting molecules to be in an excited state, releasing light energy through the transparent hole transport layer 117 and the ITO anode layer 118 to form the screen light of the OLED screen component 11.

In the present embodiment, as is shown in FIG. 2, the first light sensor 12 and the second light sensor 13 are disposed under the self-emitting light layer 111 and at positions corresponding to the optical microholes 113. The first light sensor 12 corresponds to the optical microhole 113, which means the projections of the first light sensor 12 and the self-emitting light layer 111 in a direction perpendicular of the optical microhole 113 coincide; the second light sensor 13 corresponds to the optical microhole 113, which means the projections of the second light sensor 13 and the self-emitting light layer 111 in a direction perpendicular of the optical microhole 113 coincide. The first light sensor 12 can only obtain the light intensity leaked from the self-emitting light layer 111. The second light sensor 13 can obtain the ambient light intensity in its sensing range (such as the front area of the OLED screen) and the light intensity leaked from the self-emitting light layer self-emitting light layer 111.

The working principle of the light sensor is as follows: the light sensor converts a received light signal into a current signal, the current signal is weak, so the current signal is amplified by a Current Amplifier (CA) and the amplified current is output. The amplified current signal includes noise, and after filtering the current signal, the current signal is converted into a voltage signal by a ground resistance, and the converted voltage signal is subjected to an Analog-to-Digital Converter (ADC) signal collection through an analog-to-digital conversion module, and the ADC signal is input to the Application Processor (AP) through a bus interface and logic control. The AP controls the configuration of Integrated Circuit (IC) through the bus, increasing the parameters of integration time, op amp gain and etc. of IC to achieve the collection and conversion of the light information.

The various circuits, device components, modules, units, blocks, or portions may have modular configurations, or are composed of discrete components, but nonetheless can be referred to as "units," "modules," or "portions" in general. In other words, the "circuits," "components," "modules," "blocks," "portions," or "units" referred to herein may or may not be in modular forms.

In some embodiments, as shown in FIG. 2, an incident light path of the light emitted by the self-emitting light layer 111 to the light transmitting functional layer 112, and a reflected light path formed by the light reflected by the light transmitting functional layer 112, forming a first optical path; a first polarizer 14 and a quarter phase retarder 15 are disposed on the first optical path; the first polarizer 14 and the quarter phase retarder 15 are disposed on the first optical path.

The quarter phase retarder 15 may also be referred to as a quarter wave plate. The quarter phase retarder 15 may produce a phase difference of $\pi/2$ between two mutually perpendicular light vibrations, and the quarter phase retarder 15 is usually composed of a birefringent wafer such as quartz, calcite or mica having a precise thickness, the optical axis of which is perpendicular to the wafer surface. When the linearly polarized light passes through the quarter phase retarder 15, it may become circularly polarized light or elliptically polarized light.

The incident light path of the ambient light to the first light sensor 12 passes through the first polarizer 14 and the second polarizer 16, and the polarization directions of the first polarizer 14 and the second polarizer 16 are perpendicular. Since the polarization directions of the first polarizer 14 and the second polarizer 16 are perpendicular, the ambient light cannot reach the first light sensor 13 after being filtered by the first polarizer 14 and the second polarizer 16. The incident light path of the ambient light to the second light sensor 13 passes through the first polarizer 14.

In some embodiments, the first polarizer 14 is disposed above the self-emitting light layer 111, and the quarter phase retarder 15 is disposed above the first polarizer 14. After the light emitted from the self-emitting light layer 111 passes through the first polarizer 14, the light whose vibration direction is consistent with the polarization direction of the first polarizer 14 is left. After the left light passes through the quarter phase retarder 15, the vibration direction changes by $\pi/2$, the light after the change of the vibration direction is reflected by the light transmitting functional layer 112 to form a reflected light. After the reflected light passes through the quarter phase retarder 15, the vibration direction of the reflected light changes by $\pi/2$. After the above described two changes of vibration direction, the vibration direction of the light reaching the first polarizer 14 is perpendicular to the polarization direction of the first polarizer 14, thus it may be filtered by the first polarizer 14, and thus the light emitted from the self-emitting light layer 111 cannot reach the first light sensor 12. The light intensity may be calculated by Marius's law $I(\theta)=I(0)\cos^2(\theta)$, where, $I(\theta)$ represents light intensity, $I(0)$ represents the original light intensity, $\theta$ represents the angle between the vibration direction of the light and the polarization direction of the polarizer. Only a quarter of the original ambient light left when the ambient light that reaches the second light sensor 13 after passing through the first polarizer 14 and the quarter phase retarder 15.

In some embodiments, the second polarizer 16 is disposed between the first light sensor 12 and the self-emitting light layer 111. The ambient light cannot reach the first light sensor 12 after being filtered by the first polarizer 14 and the second polarizer 16, after the light leaked from the self-emitting light layer 111 passes through the second polarizer 16, only the light whose vibration direction is the same as the polarization direction of the second polarizer 16 left. Therefore, the light received by the first light sensor 12 is half of the light intensity leaked from the self-emitting light layer 111. Illustratively, the second polarizer 16 may be a Polyethylenetthalate (PET) film attached to a photosensitive surface side of the first light sensor 12, for example, when the first light sensor 12 is an array composed of a plurality of photosensitive cells, a PET film perpendicular to the polarization direction of the first polarizer 14 is plated on the plurality of photosensitive cells, which can form the second polarizer 16.

In some embodiments, the photosensitive area of the first light sensor 12 and the second light sensor 13 overlap. The photosensitive area of the first light sensor 12 refers to the area where the first light sensor 12 measures the light intensity, and the photosensitive area of the second light sensor 13 refers to the area where the second light sensor 13 measures the light intensity. Considering that the self-emitting light layer 111 has different display parameters in different area when displaying an image, if the photosensitive area of the first light sensor 12 and the second light sensor 13 complementarity overlap, the light intensity of the first light sensor 12 and the second light sensor 13 actually received from the self-emitting light layer 111 may be different. Through overlapping the photosensitive area of the first light sensor 12 and the second light sensor 13, the light intensity leaked from the self-emitting light layer 111 received by the first light sensor 12 and the second light sensor 13 may be the same. Therefore, the intensity of the ambient light finally measured is more accurate. The photosensitive angle of the first light sensor 12 and the second light sensor 13 are generally 120°. Through arranging the first light sensor 12 and the second light sensor 13 adjacently, such that the photosensitive area of the first light sensor 12 and the second light sensor 13 overlap as much as possible.

In some embodiments, the mobile terminal further includes: a processing component, configured to obtain a first measurement value of the first light sensor 12 and a second measurement value of the second light sensor 13; calculate a difference value between the second measurement value and twice of the first measurement value; and determine light intensity of the ambient light according to the difference value.

When the position of the polarizer is as shown in FIG. 2, the first measurement value is half of the light intensity of the light leaked from the self-emitting light layer 111, and the second measurement value is the sum of one quarter of the light intensity of the ambient light and the light intensity of the light leaked form the self-emitting light layer 111, so the difference value between the second measurement value and twice of the first measurement value is multiplied by 4 to obtain the light intensity of the ambient light. For example, assuming that the second measurement value is 10 and the first measurement value is 3, and the ambient light has a light intensity of (10−2*3)*4=16.

It should be noted that the mobile terminal may adjust the brightness of the screen according to the light intensity of the ambient light calculated by the processing component, or may directly adjust the brightness of the screen according to the difference value.

In the present embodiment, the first polarizer 14 and the quarter phase retarder 15 may be provided by the OLED screen or may be additionally provided; the second polarizer 16 may be an additional polarizer.

As such, in the technical solution provided by the embodiments of the present disclosure, through disposing two light sensors under the self-emitting light layer and disposing two polarizers in the body, the ambient light cannot reach the first light sensor after being filtered by the first polarizer and the second polarizer, the light emitted from the self-emitting light layer cannot reach the first light sensor and the second light sensor after being filtered by the first polarizer and the quarter phase retarder, the second light sensor may obtain the ambient light intensity and the light intensity leaked from the self-emitting light layer, and the first light sensor may only obtain the light intensity leaked from the self-emitting light layer. Through calculating the measurement values of the two light sensors, the size of the ambient light intensity may be obtained, which effectively reduces influence of the light emitted by the self-emitting light layer on the measurement accuracy of the ambient light intensity, thereby improving the measurement accuracy of the ambient light intensity by the light sensor.

Figure 4:
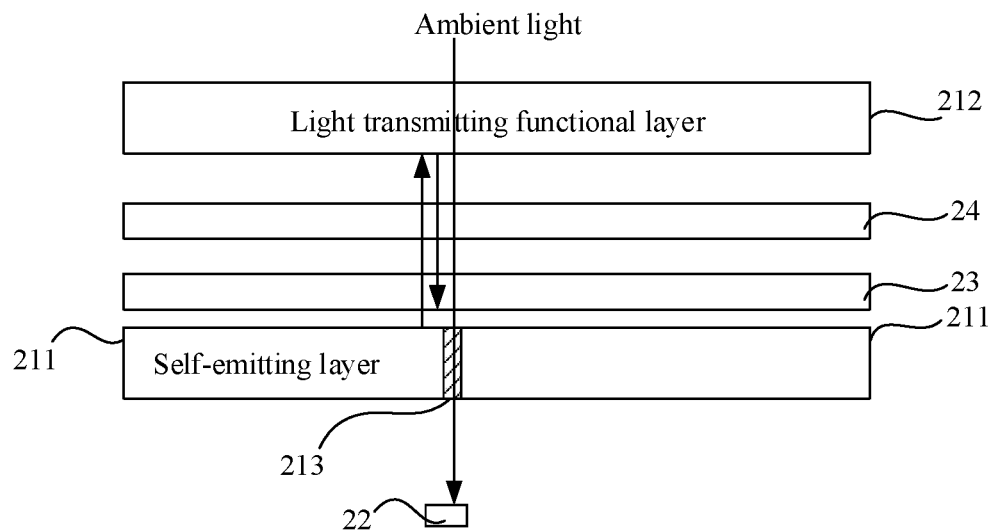
FIG. 4 is a schematic structural diagram shown an optical path design according to an exemplary embodiment.

Through referring to FIG. 1 and FIG. 4, a schematic structural diagram of another mobile terminal is exemplarily shown. The mobile terminal includes a body 10, an OLED screen component 11, and a light sensor 22.

The body 10, which may also be referred to as a mobile phone body, is a main body frame of the mobile terminal. The body 10 is generally in the shape of a hexahedron, and a part of edges or corners of the hexahedron may be formed with a curved chamfer. The front surface of the body 10 is generally a rounded rectangle or a rectangular rectangle.

The OLED screen component 11 is disposed on the surface of the body 10. In some embodiments, the OLED screen component 11 is disposed on the front surface of the body 10. In some other embodiments, the OLED screen component 11 may also be disposed on the back surface or side surface of the body 10, the position of the OLED screen component 11 on the body 10 is not limited in the embodiments of the present disclosure.

The light sensor 22 may obtain ambient light intensity in its sensing range (such as the area in front of the OLED screen). In some embodiments, the mobile terminal adaptively adjusts the brightness of the screen according to the ambient light intensity, and brings a good visual effect to users.

As is shown in FIG. 4, the OLED screen component 11 includes: a self-emitting light layer 211 and a light transmitting functional layer 212 above the self-emitting light layer 211, and at least one optical microhole 213 is formed in the self-emitting light layer.

The self-emitting light layer 211 refers to a layer level having the characteristic of self-emitting light in the OLED screen component 21. The self-emitting layer 211 is also referred to as an organic light-emitting layer, which is made of an organic light-emitting material. The principle of light-emitting of the self-emitting light layer 211 is as follows: driven by an applied voltage, holes and electrons are injected from the positive and the negative electrodes into the self-emitting light layer 211 respectively, the electrons and the holes meet and recombine in the self-emitting light layer 211, releasing energy and transferring the energy to the molecules of the organic light-emitting material, making the molecules transit from the ground state to the excited state. The excited state is unstable, the excited molecules return from the excited state to the ground state, and radiation transitions produce luminescence phenomenon.

The light transmitting functional layer 212 refers to a layer level having light transmitting properties in the OLED screen component 21, that is, light transmittance of the light transmitting functional layer 212 is greater than zero. The light transmittance is a percentage of the luminous flux transmitted through the medium (such as the light transmitting functional layer 212 in the embodiments of the present disclosure) and the incident luminous flux. Light transmittance may also be referred to as transmittance. In some embodiments, the light transmittance of the light transmitting functional layer 212 is greater than a preset threshold, such as the light transmittance of the light transmitting functional layer 212 is greater than 30%. The light transmitting functional layer 212 may be made of a light transmitting material such as glass, light transmitting ink or light transmitting plastic.

In some embodiments, the light transmitting functional layer 212 includes a combination of any one or more of the followings: a glass cover plate and a touch panel. The glass cover has a function of protecting internal structure of the mobile terminal; the touch panel has a function of receiving a user's touch operation (such as clicking, sliding, pressing, etc.).

The optical microhole 213 refers to a through hole penetrating the self-emitting light layer 211 from the top to the bottom having a light transmitting function. In some embodiments, the optical microhole 213 is a through hole of a micron-scale or smaller unit layer level, that is, the optical microhole 213 is a through hole that is invisible to naked eyes.

In the present embodiment, as is shown in FIG. 4, the light sensor 22 is disposed under the self-emitting light layer 211 and at a position corresponding to the optical microhole 213.

The light sensor 22 is located at a position corresponding to the optical microhole 213. Since the optical microhole 213 has a light transmitting property, the ambient light may be ensured to reach the light sensor 22 through the optical microhole 213.

Figure 5:
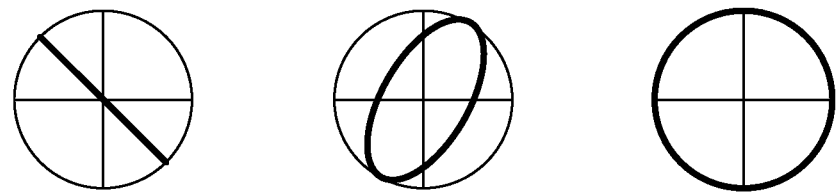
FIG. 5 is a schematic diagram shown an end point trajectory of an electric field vector according to an exemplary embodiment.

Since the self-emitting light layer 211 is located below the light transmitting functional layer 212, after the light emitted from the self-emitting light layer 211 reaches the light transmitting functional layer 212, a reflected light is generated. The portion of the reflected light may be received by the light sensor 22, thereby causing the light sensor 22 to affect the measurement accuracy of the ambient light intensity. In the present embodiment, as is shown in FIG. 5, an incident light path of the light emitted by the self-emitting light layer 211 to the light transmitting functional layer 212, and a reflected light path formed by the light reflected by the light transmitting functional layer 212, forming a first optical path; the polarizer 23 and the quarter phase retarder 24 are disposed on the first optical path.

The polarizer 23 is an optical filter which only allows light waves polarized in a specific direction (polarization direction) to pass, that is, the polarizer 23 has a function of shielding and transmitting the incident light. When the light wave passes through the polarizer 23, one of orthogonal polarization components is strongly absorbed by the polarizer 23, and the other component is weakly absorbed, so the polarizer 23 can convert the incident light, composite light or monochromatic light into linearly polarized light. In the present embodiment, at least one polarizer 23 is disposed on the first optical path, and the polarizer 23 can absorb the light intensity of the vibration direction of the incident light path and/or of the reflected light path perpendicular to the polarization direction of the polarizer 23, thereby reducing the light intensity emitted by the self-emitting light layer 211 and received by the light sensor 22, reducing the influence of the light intensity generated by the OLED screen on the measurement accuracy of the light sensor 22, and improving the measurement accuracy of the light sensor 22.

The incident light path of the ambient light to the light sensor 22 passes through the light transmitting functional layer 212, the quarter phase retarder 24, the polarizer 23 and the optical microhole 213.

In some embodiments, the polarizer 23 is disposed above the self-emitting light layer 211, and the quarter phase retarder 24 is disposed above the polarizer 23.

In some embodiments, the mobile terminal further includes: a processing component, configured to obtain a measurement value of the light sensor 22; and determine the light intensity of the ambient light according to the measurement value. In the embodiment, the light intensity of the ambient light is four times of the measurement value of the light sensor 22.

It should be noted that the mobile terminal may adjust the brightness of the screen according to the light intensity of the ambient light calculated by the processing component, or may directly adjust the brightness of the screen according to the measurement value of the light sensor 22.

In addition, in the present embodiment, the polarizer 23 may be a polarizer 23 that is included in the OLED screen, or may be an additional polarizer 23.

As such, in the technical solution provided by the embodiments of the present disclosure, through providing a polarizer on the first optical path, the polarizer may absorb the light intensity of the vibration direction of the incident light path and/or the reflected light path perpendicular to the polarization direction of the polarizer, and the light may change the polarization direction when passing through the quarter-phase retarder twice, so that the light sensor may not receive the light intensity emitted by the self-emitting light layer, which effectively reduces influence of the light emitted by the self-emitting light layer on the light sensor, thereby improving the measurement accuracy the light sensor on the ambient light intensity.

Next, polarization of light will be described.

Light is an electromagnetic wave. At the same time, light is also a transverse wave, that is, the direction of the electric field and the magnetic field of the light is perpendicular to the direction of the light transmission, so that the electromagnetic wave propagating along the z-axis direction may be composed of $E_x$ and $E_y$, assuming:

$$\begin{cases} \vec{E}_{OLED} = \vec{E}_x \vec{e}_x + \vec{E}_y \vec{e}_y = E_{0x}\vec{e}_x e^{-j(\beta_1 z - \varphi_{1x})} + E_{0y}\vec{e}_y e^{-j(\beta_1 z - \varphi_{1y})} \\ \vec{E}_{ambient} = \vec{E}_x \vec{e}_x + \vec{E}_y \vec{e}_y = E_{0x}\vec{e}_x e^{-j(\alpha_1 z - \varphi_{2x})} + E_{0y}\vec{e}_y e^{-j(\alpha_1 z - \varphi_{2y})} \end{cases} \quad (1)$$

where, $\vec{E}_{OLED}$ represents light emitted from the self-emitting light layer, $\vec{E}_{ambient}$ represents ambient light, $\vec{e}_x$ represents unit vector of the x-axis, $\vec{e}_y$ represents unit vector of the y-axis, $\vec{E}_x$ represents vibration component on the x-axis, $\vec{E}_y$ represents vibration component on the y-axis, $\varphi_{1x}$, $\varphi_{2x}$ represents the phase of the vibration component on the x-axis, $\varphi_{1y}$, $\varphi_{2y}$ represents the phase of the vibration component on the y-axis, $E_{0x}$ represents the amplitude of the x component, $E_{0y}$ represents the amplitude of the y component, $\beta_1$, $\alpha_1$ represents the moving velocity of the electromagnetic wave, $E_{0x}$ represents the maximum amplitude of the vibration component on the x-axis, $E_{0y}$ represents the maximum amplitude of the vibration component on the y-axis.

Multiply the equation (1) by the real part and expand the instantaneous component of the vibration of the electromagnetic wave on the x-axis and the y-axis to obtain the component of the light emitted from the self-emitting light layer on the x-axis and the y-axis and the component of the ambient light on the x-axis and y-axis:

$$\begin{cases} E_{oled_x}(t) = E_{0x}\cos(\omega_0 t + \beta_1 z + \varphi_{1x}) \\ E_{oled_y}(t) = E_{0y}\cos(\omega_0 t + \beta_1 z + \varphi_{1y}) \end{cases} \quad (2)$$

where, $E_{oled_x}(t)$ represents the component of the light emitted from the self-emitting light layer on the x-axis, $E_{oled_y}(t)$ represents the component of the light emitted from the self-emitting light layer on the y-axis, $\omega_0$ represents angular frequency.

$$\begin{cases} E_{ambient_x}(t) = E_{0x}\cos(\omega_a t + \alpha_1 z + \varphi_{2x}) \\ E_{ambient_y}(t) = E_{0y}\cos(\omega_a t + \alpha_1 z + \varphi_{2y}) \end{cases} \quad (3)$$

where, $E_{ambient_x}(t)$ represents the component of the ambient light on the x-axis, $E_{ambient_y}(t)$ represents the component of the ambient light on the y-axis, $\omega_0$ represents angular frequency.

The equation (4) is obtained by analyzing the vibration of the electromagnetic wave when the equation (2) taking the function expression of Z=0:

$$\begin{cases} E_{oled_x}(t) = E_{0x}\cos(\omega_0 t + \varphi_{1x}) \\ E_{oled_y}(t) = E_{0y}\cos(\omega_0 t + \varphi_{1y}) \end{cases} \quad (4)$$

The equation (5) is obtained by analyzing the vibration of the electromagnetic wave when the equation (3) taking the function expression of z=0:

$$\begin{cases} E_{ambient_x}(t) = E_{0x}\cos(\omega_a t + \varphi_{2x}) \\ E_{ambient_y}(t) = E_{0y}\cos(\omega_a t + \varphi_{2y}) \end{cases} \quad (5)$$

The phases of $E_x(t)$ and $E_y(t)$ are not necessarily the same, the phases are not the same especially for the external natural electromagnetic wave. The actual light wave $\vec{E}$ varies with time (t) and space (x, y, z), that is E=F (x, y, z, t), $\vec{E}$ represents changing trend of the vector orientation of the electric field strength of the light wave with time, whose trajectory may be described by a changing curve of the end point of the electric field strength vector with time. Seen along the direction of propagation of the light wave, that is, the direction of propagation along the z-axis, the light wave whose end point vibrates in a straight line is linearly polarized light, and if its trajectory is a circle, it is called circular polarization, which may be distinguished between linear polarization and circular polarization based on the phase difference $\Delta\varphi = \varphi_y - \varphi_x$ of the components on the x-axis and y-axis.

Eliminate the variable $\omega_0 t$ in equation (4) and get:

$$\frac{E_x^2(t)}{E_{0x}^2} - 2\frac{E_x(t)E_y(t)}{E_{0x}E_{0y}}\cos(\Delta\varphi) + \frac{E_y^2(t)}{E_{0y}^2} = \sin(\Delta\varphi)^2; \quad (6)$$

When $\Delta\varphi = \varphi_y - \varphi_x = n\pi$, n=0, 1, 2, 3 . . . , the light wave polarization is linear polarization, and the end point trajectory of the electric field vector E is in a straight line;
When $$\Delta\varphi = \varphi_y - \varphi_x = \frac{n\pi}{2}, n = 2k+1, k=1, 2, 3, 4, 5 \ldots,$$

the light wave polarization is a circular polarization, and the equation (6) becomes:

$$\frac{E_x^2(t)}{E_{0x}^2} + \frac{E_y^2(t)}{E_{0y}^2} = 1; \quad (7)$$

When $E_{0x}=E_{0y}$, the light wave polarization is a circular polarization, and the end point trajectory of the electric field vector E is a circle as seen from the direction of the z-axis;

When $E_{0x} \neq E_{0y}$, the light wave polarization is elliptical polarization, and the end point trajectory of the electric field vector E is an ellipse as seen from the direction of the z-axis. As shown in FIG. 5, it shows a schematic diagram of an end point trajectory of an electric field vector. The bold line in FIG. 5 represents the end point trajectory of the electric field vector. The left image in FIG. 5 represents linear polarization, the intermediate image represents elliptical polarization, and the right image represents circular polarization.

Based on the above derivation and theoretical analysis, at least one polarizer is disposed on the first optical path, which may effectively reduce the influence of the light emitted from the self-emitting light layer on the light sensor.

The crystal has an attribute, that is, anisotropy. The light wave incident on the anisotropic crystal is decomposed into polarized light whose vibration direction is vertical and the phase velocity is not equal. The difference in phase velocity is due to the difference in refractive index for the two kinds of light waves. The difference in refractive index is due to the difference in the dielectric constant of the crystal, and the refractive index is equal to the square root of the dielectric constant.

The electromagnetic light wave incident on the anisotropic group may be decomposed into light waves whose electric field vibration directions are perpendicular to each other, that is, o light and e light, o light is called ordinary light, e light is called abnormal light, o light has the same phase velocity in all directions of the crystal, and the e light has different phase velocities in different directions.

Assuming the thickness of the polarizer of the OLED screen to be L, the optical path of the o light passing through the crystal is L, the wave vector is $K_o = 2\pi n_o/\lambda$, the optical path of the e-light is also L, then the wave vector is $K_e = 2\pi n_e/\lambda$, then the phase difference of the two is: $\varphi = 2\pi(n_e - n_o)/\lambda$, adjusting $n_e - n_o$ and $\lambda$ to achieve a quarter-wavelength change, making a linearly polarized light to become circularly or elliptically polarized.

It should be understood that "a plurality"" as referred to herein means two or more. "and/or" describes the association relationship of the associated objects, and indicates that there may be three relationships, for example, A and/or B, may indicate that there are three cases where A exists separately, A and B exist at the same time, and B exists separately. The character "/" generally indicates that the associated object is an "or" relationship.

In the present disclosure, it is to be understood that the terms "lower," "upper," "center," "longitudinal," "transverse," "length," "width," "thickness," "upper," "lower," "front," "back," "left," "right," "vertical," "horizontal," "top," "bottom," "inside," "outside," "clockwise," "counter-clockwise," "axial," "radial," "circumferential," "column," "row," and other orientation or positional relationships are based on example orientations illustrated in the drawings, and are merely for the convenience of the description of some embodiments, rather than indicating or implying the device or component being constructed and operated in a particular orientation. Therefore, these terms are not to be construed as limiting the scope of the present disclosure.

Moreover, the terms "first" and "second" are used for descriptive purposes only and are not to be construed as indicating or implying a relative importance or implicitly indicating the number of technical features indicated. Thus, elements referred to as "first" and "second" may include one or more of the features either explicitly or implicitly. In the description of the present disclosure, "a plurality" indicates two or more unless specifically defined otherwise.

In the present disclosure, the terms "installed," "connected," "coupled," "fixed" and the like shall be understood broadly, and may be either a fixed connection or a detachable connection, or integrated, unless otherwise explicitly defined. These terms can refer to mechanical or electrical connections, or both. Such connections can be direct connections or indirect connections through an intermediate medium. These terms can also refer to the internal connections or the interactions between elements. The specific meanings of the above terms in the present disclosure can be understood by those of ordinary skill in the art on a case-by-case basis.

In the present disclosure, a first element being "on," "over," or "below" a second element may indicate direct contact between the first and second elements, without contact, or indirect through an intermediate medium, unless otherwise explicitly stated and defined.

Moreover, a first element being "above," "over," or "at an upper surface of" a second element may indicate that the first element is directly above the second element, or merely that the first element is at a level higher than the second element. The first element "below," "underneath," or "at a lower surface of" the second element may indicate that the first element is directly below the second element, or merely that the first element is at a level lower than the second feature. The first and second elements may or may not be in contact with each other.

In the description of the present disclosure, the terms "one embodiment," "some embodiments," "example," "specific example," or "some examples," and the like may indicate a specific feature described in connection with the embodiment or example, a structure, a material or feature included in at least one embodiment or example. In the present disclosure, the schematic representation of the above terms is not necessarily directed to the same embodiment or example.

Moreover, the particular features, structures, materials, or characteristics described may be combined in a suitable manner in any one or more embodiments or examples. In addition, various embodiments or examples described in the specification, as well as features of various embodiments or examples, may be combined and reorganized.

In addition to the display screen, other types of devices can be used to provide on the mobile terminal for interaction with a user as well; for example, feedback provided to the user can be any form of sensory feedback, e.g., visual feedback, auditory feedback, or tactile feedback; and input from the user can be received in any form, including acoustic, speech, or tactile input. In an example, a user can speak commands to the audio processing device, to perform various operations.

should not be construed as limitations on the scope of any claims, but rather as descriptions of features specific to particular implementations. Certain features that are described in this specification in the context of separate implementations can also be implemented in combination in a single implementation. Conversely, various features that are described in the context of a single implementation can also be implemented in multiple implementations separately or in any suitable subcombinations.

Moreover, although features may be described above as acting in certain combinations and even initially claimed as such, one or more features from a claimed combination can in some cases be excised from the combination, and the claimed combination may be directed to a subcombination or variations of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

Thus, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking or parallel processing may be utilized.

It is intended that the specification and embodiments be considered as examples only. Other embodiments of the disclosure will be apparent to those skilled in the art in view of the specification and drawings of the present disclosure. That is, although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the example embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A mobile terminal, comprising: a body, an organic light-emitting diode (OLED) screen component, a first light sensor, and a second light sensor;
   wherein, the OLED screen component is disposed over a surface of the body, and the OLED screen component comprises: a self-emitting light layer and a light transmitting functional layer above the self-emitting light layer; at least one optical microhole being formed in the self-emitting light layer;
   the first light sensor and the second light sensor are disposed under the self-emitting light layer and at positions corresponding to the optical microhole;
   wherein, an incident light path of light emitted by the self-emitting light layer to the light transmitting functional layer, and a reflected light path formed by the light reflected by the light transmitting functional layer, forming a first optical path; a first polarizer and a quarter phase retarder are disposed on the first optical path; and
   an incident light path of an ambient light to the first light sensor passes through the first polarizer and a second polarizer, and polarization directions of the first polarizer and the second polarizer are perpendicular; an incident light path of the ambient light to the second light sensor passes through the first polarizer.

2. The mobile terminal according to claim 1, wherein the first polarizer is disposed above the self-emitting light layer, and the quarter phase retarder is disposed above the first polarizer.

3. The mobile terminal according to claim 1, wherein the second polarizer is disposed between the first light sensor and the self-emitting light layer.

4. The mobile terminal according to claim 1, wherein photosensitive areas of the first light sensor and the second light sensor overlap.

5. The mobile terminal according to claim 1, wherein the light transmitting functional layer comprises a combination of any one or more of followings: a glass cover plate and a touch panel.

6. The mobile terminal according to claim 1, wherein the mobile terminal further comprises: a processing component, configured to:
   obtain a first measurement value of the first light sensor and a second measurement value of the second light sensor;
   calculate a difference value between the second measurement value and twice of the first measurement value; and
   determine light intensity of the ambient light according to the difference value.

7. The mobile terminal according to claim 2, wherein the mobile terminal further comprises: a processing component, configured to:
- obtain a first measurement value of the first light sensor and a second measurement value of the second light sensor;
- calculate a difference value between the second measurement value and twice of the first measurement value; and
- determine light intensity of the ambient light according to the difference value.

8. The mobile terminal according to claim 3, wherein the mobile terminal further comprises: a processing component, configured to:
- obtain a first measurement value of the first light sensor and a second measurement value of the second light sensor;
- calculate a difference value between the second measurement value and twice of the first measurement value; and
- determine light intensity of the ambient light according to the difference value.

9. The mobile terminal according to claim 4, wherein the mobile terminal further comprises: a processing component, configured to:
- obtain a first measurement value of the first light sensor and a second measurement value of the second light sensor;
- calculate a difference value between the second measurement value and twice of the first measurement value; and
- determine light intensity of the ambient light according to the difference value.

10. The mobile terminal according to claim 5, wherein the mobile terminal further comprises: a processing component, configured to:
- obtain a first measurement value of the first light sensor and a second measurement value of the second light sensor;
- calculate a difference value between the second measurement value and twice of the first measurement value; and
- determine light intensity of the ambient light according to the difference value.

11. A mobile terminal, comprising: a body, an organic light-emitting diode (OLED) screen component, and a light sensor;
- wherein, the OLED screen component is disposed over a surface of the body, and the OLED screen component comprises: a self-emitting light layer and a light transmitting functional layer above the self-emitting light layer; at least one optical microhole being formed in the self-emitting light layer;
- the light sensor is disposed under the self-emitting light layer and at a position corresponding to the optical microhole;
- wherein, an incident light path of light emitted by the self-emitting light layer to the light transmitting functional layer, and a reflected light path formed by the light reflected by the light transmitting functional layer, forming a first optical path; a polarizer and a quarter phase retarder are disposed on the first optical path;
- an incident light path of an ambient light to the light sensor passes through the light transmitting functional layer, the quarter phase retarder, the polarizer and the optical microhole.

12. The mobile terminal according to claim 11, wherein the first polarizer is disposed above the self-emitting light layer, and the quarter phase retarder is disposed above the polarizer.

13. The mobile terminal according to claim 11, wherein the light transmitting functional layer comprises a combination of any one or more of followings: a glass cover plate and a touch panel.

14. The mobile terminal according to claim 11, wherein the mobile terminal further comprises: a processing component, configured to:
- obtain a measurement value of the light sensor; and
- determine light intensity of the ambient light according to the measurement value.

15. The mobile terminal according to claim 12, wherein the mobile terminal further comprises: a processing component, configured to:
- obtain a measurement value of the light sensor; and
- determine light intensity of the ambient light according to the measurement value.

16. The mobile terminal according to claim 13, wherein the mobile terminal further comprises: a processing component, configured to:
- obtain a measurement value of the light sensor; and
- determine light intensity of the ambient light according to the measurement value.

17. The mobile terminal according to claim 1, wherein the polarizer on the first optical path is configured to absorb light intensity of the vibration direction perpendicular to a polarization direction of the polarizer in the incident light path and/or the reflected light path, and wherein the quarter-phase retarder is configured to change the polarization direction when light passes through the quarter-phase retarder twice, such that the light sensor does not receive the light intensity emitted by the self-emitting light layer, thereby reducing influence of the light emitted by the self-emitting light layer on the light sensor, and improving measurement accuracy of the ambient light intensity by the light sensor.

18. The mobile terminal according to claim 17, wherein the ambient light is prevented from reach the first light sensor after being filtered by the first polarizer and the second polarizer, and the light emitted from the self-emitting light layer is prevented from reaching the first light sensor and the second light sensor after being filtered by the first polarizer and the quarter phase retarder.

19. The mobile terminal according to claim 18, wherein the second light sensor is configured to obtain the ambient light intensity and the light intensity leaked from the self-emitting light layer, and the first light sensor is configured to only obtain the light intensity leaked from the self-emitting light layer.

20. The mobile terminal according to claim 19, wherein the mobile terminal is configured to calculate, based on measurement values of the two light sensors, intensity of the ambient light intensity, thereby reducing influence of the light emitted by the self-emitting light layer on the measurement accuracy of the ambient light intensity and improving the measurement accuracy of the ambient light intensity by the light sensor.

\* \* \* \* \*